(12) United States Patent
Wacyk

(10) Patent No.: US 10,128,317 B2
(45) Date of Patent: Nov. 13, 2018

(54) METHOD FOR ELIMINATING ELECTRICAL CROSS-TALK IN OLED MICRODISPLAYS

(71) Applicant: eMagin Corporation, Hopewell Junction, NY (US)

(72) Inventor: Ihor Wacyk, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 14/971,228

(22) Filed: Dec. 16, 2015

(65) Prior Publication Data

US 2016/0180769 A1    Jun. 23, 2016

Related U.S. Application Data

(60) Provisional application No. 62/095,494, filed on Dec. 22, 2014.

(51) Int. Cl.
| | |
|---|---|
| *H01L 29/08* | (2006.01) |
| *H01L 27/32* | (2006.01) |
| *H01L 51/52* | (2006.01) |

(52) U.S. Cl.
CPC ........ *H01L 27/3206* (2013.01); *H01L 27/326* (2013.01); *H01L 27/3211* (2013.01); *H01L 27/3276* (2013.01); *H01L 51/5206* (2013.01); *H01L 2227/323* (2013.01)

(58) Field of Classification Search
CPC ............. H01L 27/3276; H01L 27/326; H01L 27/3211; H01L 51/5206; H01L 51/0096; H01L 27/3206; G09G 3/3225
USPC .......................................................... 257/40
See application file for complete search history.

(56) References Cited

U.S. PATENT DOCUMENTS

| | | | | |
|---|---|---|---|---|
| 2004/0140553 | A1* | 7/2004 | Naito ....................... | H01G 4/30 257/700 |
| 2015/0206931 | A1* | 7/2015 | Choi ................... | H01L 27/3272 257/72 |

* cited by examiner

*Primary Examiner* — Hung Vu
(74) *Attorney, Agent, or Firm* — Kaplan Breyer Schwarz, LLP

(57) ABSTRACT

An OLED microdisplay comprising a substrate, a pixel array and a patterned conductive layer underneath the anode pad array to form an effective ground plane in order to greatly reduce or eliminate electrical cross-talk between pixels, and a method for fabricating same.

13 Claims, 9 Drawing Sheets

Top view of anode and ground plane

Cross-section

Cathode
OLED stack
Anode
Insulator
Ground-plane Metal
gnd

Electrical Model (b) No cross-talk (a) Cross-talk
(Prior art)

METHOD FOR ELIMINATING ELECTRICAL CROSS-TALK IN OLED MICRODISPLAYS

CROSS-REFERENCE TO RELATED APPLICATIONS

Priority is claimed on Provisional Patent Application No. 62/095,494, filed Dec. 22, 2014, the contents of which are incorporated herein by reference.

STATEMENT REGARDING FEDERALLY SPONSORED RESEARCH OR DEVELOPMENT

Not Applicable

REFERENCE TO A "SEQUENCE LISTING", A TABLE, OR A COMPUTER PROGRAM LISTING APPENDIX SUBMITTED ON COMPACT DISC

Not Applicable

BACKGROUND OF THE INVENTION

1. Field of the Invention

The present invention relates to OLED microdisplays and more particularly to OLED microdisplays in which electrical cross-talk is greatly reduced or eliminated and to a method of making such OLED microdisplays.

2. Description of Prior Art Including Information Disclosed Under 37 CFR 1.97 and 1.98

An understanding of how cross-talk affects the operation of organic light emitting diodes (OLEDs) in a microdisplay can be observed from FIGS. 1(a) and 1(b), which shows a closeup of a group of pixels in an operating display. Only three columns of pixels are actually being driven and only they should be emitting light while the pixels in between should be completely off or black. FIG. 1(b) shows a display operating correctly, with no visible cross-talk. FIG. 1(a), on the other hand, suffers from severe cross-talk since pixels adjacent to the driven column are also showing partial emission of light.

Electrical cross-talk is the occurrence of an unintentional signal generated on a pixel when an adjacent pixel is being driven, due to the parasitic capacitance that exists between the two pixels. Parasitic capacitance is always present between nearby conductors. However, it only becomes a problem when the magnitude of the parasitic capacitance results in an observable effect, as in the case of a display with visible cross-talk.

FIG. 2 illustrates that a typical source for the parasitic capacitance in an active-light-emitting diode (AMOLED) display is the capacitance that forms between coplanar anodes of the OLEDs.

A simplified model for how cross-talk occurs in a microdisplay is provided in FIG. 3. The circuit diagram on the left of FIG. 3 includes a pixel represented by OLED1, driven by an input signal $V_{DRIVE}$ from an off state (non-emitting or black) to an on state (emitting). It is coupled to an adjacent pixel represented by OLED2, via the parasitic capacitor $C_{ANODE}$.

The waveforms on the right of FIG. 3 show the drive signal applied to OLED1 as a step function, and the signal on the adjacent pixel OLED2 as a voltage spike. After the drive signal to OLED1 stabilizes at a high level, the signal on OLED2 starts to discharge via the resistance of the OLED diode. The resistance of the OLED diode is very high at low luminance levels so the discharge rate can be very long, resulting in a detectable amount of light from the adjacent pixel.

BRIEF SUMMARY OF THE INVENTION

Electrical cross-talk manifests itself as the coupling of drive signals between adjacent pixels in an AMOLED microdisplay. This effect degrades display performance in a number of ways including the loss of color gamut in color displays, reduction of contrast transfer function, and distortion of gamma at low gray levels.

Recent efforts to increase the color gamut of OLED microdisplays have found that the electrical cross-talk in current backplane designs prevent the inherent performance of enhanced color filters and OLED materials from being fully realized. Future displays based on direct patterning technology will also suffer from this problem due to the increased likelihood of adjacent pixels to emit light at even low levels of cross-talk because of the high efficiency of the OLED materials used.

The present invention provides a method of eliminating cross-talk in OLED microdisplays in order to overcome this problem.

In accordance with one aspect of the present invention, an OLED microdisplay is provided including a silicon substrate with integrated active matrix drivers. An OLED array including at least two color subpixels is situated over the substrate. An anode for each subpixel is provided, the anodes extending in spaced relation on the substrate. A conductive plane is situated on the substrate, in alignment with the gap between the anodes. An insulating layer is situated between the conductive layer and the anodes. An electrical connection is made between the conductive plane and ground.

The conductive plane preferably takes the form of a continuous metal sheet.

The microdisplay further includes openings patterned around vias above the silicon to connect each pixel anode.

The silicon substrate has ground line. The connection takes the form of contact points to the ground line through the substrate.

The insulating layer is formed to be thin enough to effectively suppress cross-talk between the anodes. The layers are formed such that the ratio between the anode coplanar capacitance, and the capacitance of the anode to ground, is less than 0.1.

In accordance with another aspect of the present invention, a method for fabricating an OLED microdisplay on a silicon substrate having a ground line is provided. The method includes depositing a thin conductive material layer on the substrate; creating a hole in the substrate to connect the conductive layer to the ground line, depositing a thin dielectric layer on top of the conductive layer, forming openings in the dielectric layer in alignment with the places where anodes will be formed such that driver circuits can be connected to the anodes, depositing the anodes on the dielectric surface, and forming the subpixel array.

The step of depositing the conductive layer includes depositing a continuous sheet of conductive material on the substrate.

The method further includes creating vias in the further silicon layer.

In accordance with another aspect of the present invention, an OLED microdisplay is provided including a substrate, a pixel array and a patterned conductive layer underneath the anode pad array to form an effective ground plane in order to greatly reduce or eliminate electrical cross-talk between pixels.

It is, therefore, a prime object of the present invention to provide an OLED microdisplay and a method for fabricating same in which electrical cross-talk between anode electrodes is greatly reduced or eliminated.

It is a another object of the present invention to provide an OLED microdisplay and a method for fabricating same in which electrical cross-talk between anode electrodes is greatly reduced or eliminated which can be easily introduced as part of the OLED or as part of the silicon backplane process.

It is a another object of the present invention to provide an OLED microdisplay and a method for fabricating same in which electrical cross-talk between anode electrodes is greatly reduced or eliminated which allows the size of the anode gaps to be further reduced for better fill factor without increasing electrical cross-talk in the microdisplay.

It is a another object of the present invention to provide an OLED microdisplay and a method for fabricating same in which electrical cross-talk between anode electrodes is greatly reduced or eliminated to reduce power consumption in the pixel bias circuitry that is currently used to suppress electrical cross-talk.

BRIEF DESCRIPTION OF THE SEVERAL VIEWS OF DRAWINGS

To these and to such other objects that may hereinafter appears, the present invention relates to a method for eliminating cross-talk in microdisplays as described in detail in the following specification and recited in the annexed claims, taken together with the accompanying drawings, in which like numerals refer to like parts and in which:

Figure 7:
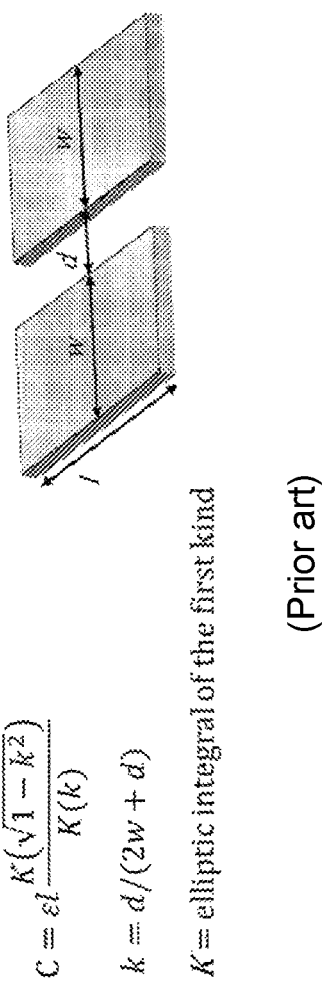
Figure 8:
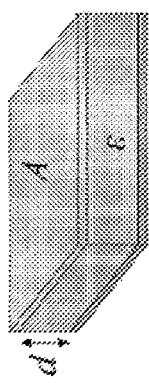
Figure 9:
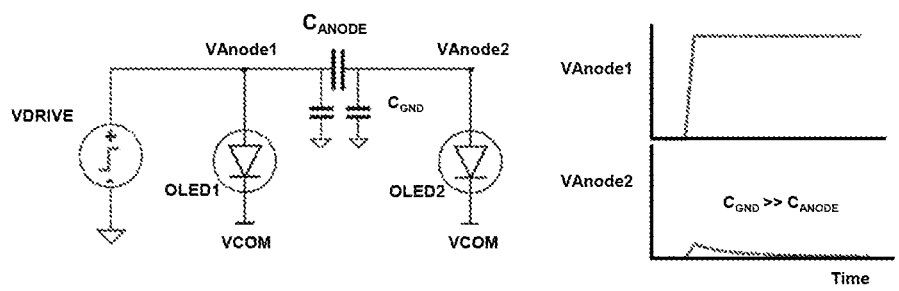

FIG. 7 includes the mathematical formula for calculating the capacitance between to coplanar electrodes on the left and a schematic representation of the electrodes on the right;

FIG. 8 includes the mathematical formula for calculating the capacitance for a simple parallel plate capacitor on the left and a schematic representation of the capacitor on the right; and FIG. 9 is a simplified electrical model for second preferred embodiment of the present invention including, at the left a schematic diagram of adjacent OLEDs and the drive signal for the OLEDs, and at the right idealized waveforms for the anodes.

DETAILED DESCRIPTION OF THE INVENTION

Figure 4:
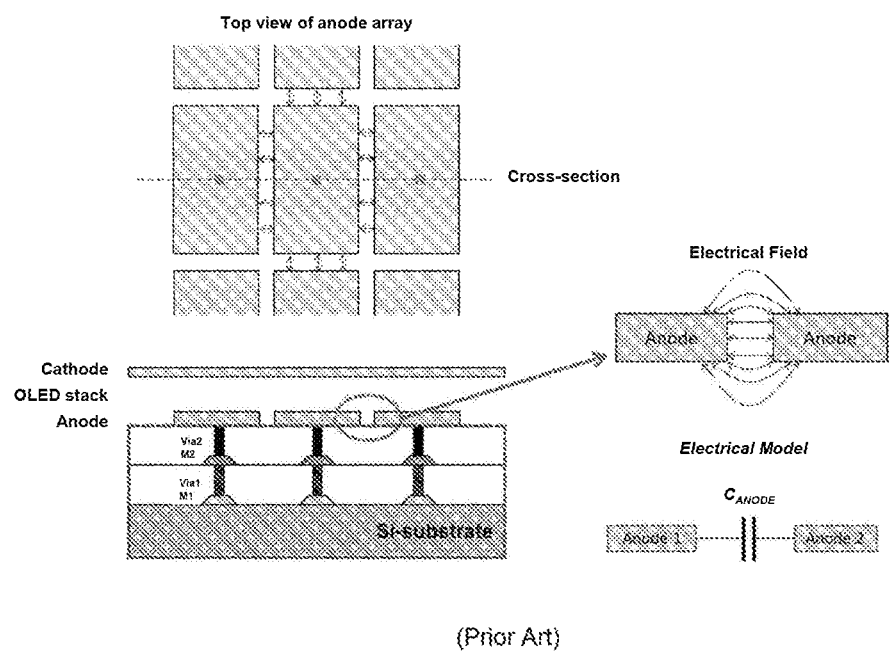
FIG. 4 shows a top view and a cross-sectional of a state-of-the-art AMOLED backplane at the left, and schematic views showing the electrical interaction between the anodes at the right.

The present invention is a method for eliminating the electrical cross-talk effect in AMOLED microdisplays. FIG. 4 is an illustration of a conventional state-of-the-art microdisplay, showing both a top and cross-sectional view of a portion of the pixel array. Electrical cross-talk is a result of the electric fields that exist between the coplanar anode plates as shown in the close-up inset. These coplanar fields create electrical cross-talk by inducing charging currents in nearest neighbor pixels, causing pixels that are supposed to be off to be slightly emitting.

To eliminate cross-talk, the coplanar fields must be terminated on a ground plane rather than on adjacent pixels. One possible solution would be to introduce a metal structure in the anode gap area to act as a ground shield. This would effectively interrupt the coplanar field and eliminate the coupling between adjacent pixels. However, that approach is impractical for a microdisplay since the trend is to reduce pixel size and to increase fill factor by minimizing the gap area. This leaves no space for an additional metal line to be placed between pixel anodes. Instead, this invention proposes an alternative approach in which a grounded metal film located directly below the anode plates is employed.

Figure 5:
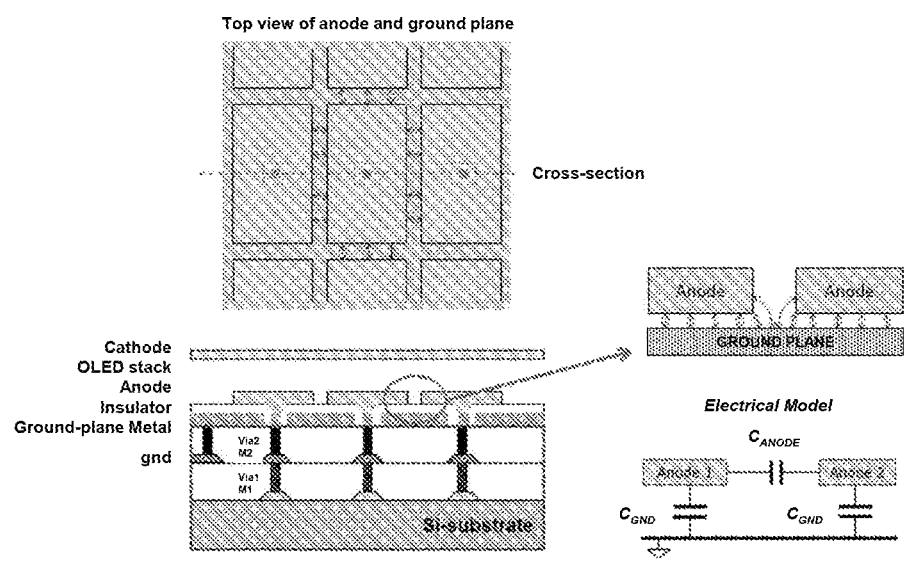
FIG. 5 illustrates a first preferred embodiment of the present invention which employs a ground plane, including a top view and a cross-sectional of the anode array with the ground plane at the left, and schematic views showing the electrical interaction between the anodes of adjacent anodes at the right.

In a first preferred embodiment of the present invention, a patterned metal layer is introduced underneath the anode layer to act as a ground plane as illustrated in FIG. 5. As shown in the inset on the right of the figure, the electric field profile in this configuration is similar to that of a microstrip line, in which the fields are mostly terminated on the ground plane resulting in greatly reduced cross-talk between the adjacent anode pads. The degree of cross-talk reduction will depend on the thickness of the insulating layer between the anode layer and the ground plane, with a thinner layer corresponding to stronger coupling to the ground plane and less cross-talk.

The structure shown in FIG. 5 consists of a thin conductive material deposited on the silicon substrate to act as the ground plane. Preferably, the ground plane would be formed as a continuous sheet located between the backplane and the OLED array, with donut shaped openings patterned around the Vias that connect to each pixel anode. The conductive layer would have contact points to the ground line in the underlying silicon to ensure that a fixed ground potential exists across the entire ground plane.

A thin dielectric would then be deposited on top of the metal layer to prevent contact between the ground plane and the anode pads. The dielectric layer could be formed of silicon dioxide. After this, holes are patterned in the dielectric layer over the Via regions to provide contact from the silicon driver circuits to the anode pads. Next the anode layer is deposited and patterned in a conventional manner. The central portion of the anode pad would make contact with the Via2 regions as in the standard OLED process.

Figure 6:
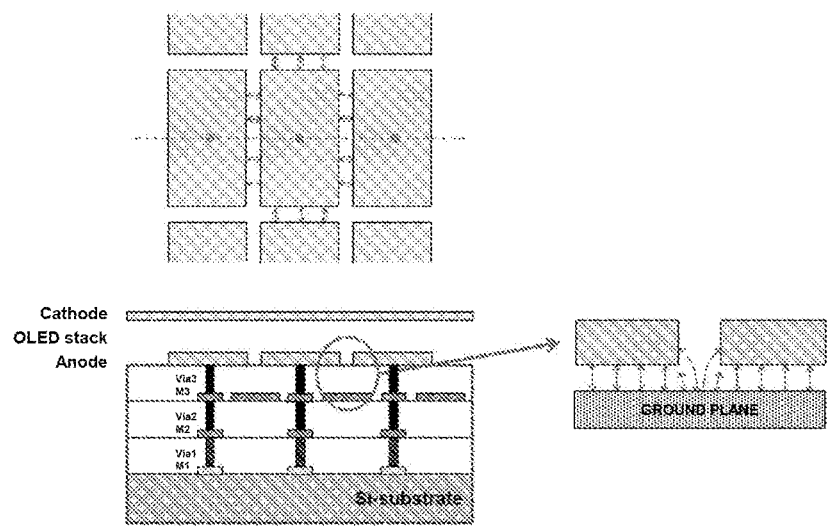
FIG. 6 illustrates a second preferred embodiment of the present invention which includes a ground plane metal layer situated above the Via2 pattern, including a top view and a cross-sectional of the anode array with the ground plane at the left, and a schematic view showing the electrical interaction between the anodes at the right.

In a second preferred embodiment of the invention, a thicker dielectric layer is situated between the ground plane and the anode layer. The ground plane metal layer could be implemented at the silicon foundry as an additional metal layer above the Via2 pattern, as shown in FIG. 6. The Via between the ground plane and the anode would be present on the wafer when delivered to the circuit manufacturer. The circuit fabricator would build the OLED on top of the ground plane metal layer in conventional fashion. A Via3 feed-through structure could be used to make the connection to the anode pads above. This approach would be transparent to the AMOLED fabrication process. The top dielectric layer would need to be thin enough to ensure that the ground plane can effectively suppress any cross-talk between the anode pads.

The key to the effective reduction of cross-talk in the invention is the ratio between the anode coplanar capacitance and the capacitance of the anode pad to ground. This ratio should be small (<0.1) in order to suppress the amount of signal that is coupled to an adjacent pixel from the driven pixel. Approximate values of capacitance for the anode can be determined for typical microdisplay parameters. The expression for capacitance between coplanar electrodes surrounded on all sides by a material of dielectric constant ε and dimensions indicated in the figure is as shown in FIG. 7. This will hold for the case of a standard microdisplay design as illustrated in FIG. 4. When the ground plane is added as shown in FIG. 5, then the capacitance between an anode electrode and the ground plane can be determined from the expression for a simple parallel plate capacitor as indicated in FIG. 8.

Assuming a typical microdisplay with w=3 um, d=1 um, l=11 um, and ε~4, the coplanar capacitance between anodes is calculated to be about 0.1 femtoFarad. When a ground plane is added and assuming a dielectric thickness d=0.2 um, the parallel plate capacitance to ground for each anode is calculated to be about 1.5 femtoFarad. For these typical values the ratio of coplanar capacitance to parallel plate capacitance is equal to 0.067. The capacitance to ground will increase as the dielectric thickness between the anode and ground decreases, further reducing this ratio. Consequently, a dielectric thickness of less than 0.2 um is desired.

Figure 1B:
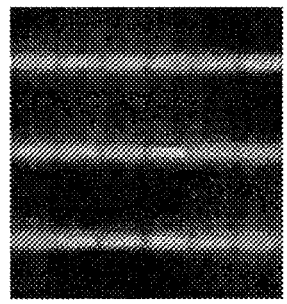
FIG. 1(a) illustrates an example of cross-talk in a display including close up images of a portion of the display showing cross-talk occurring and FIG. 1(b) showing no cross-talk.
Figure 1A:
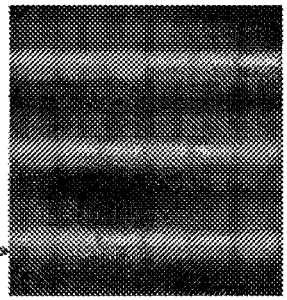
Figure 2:
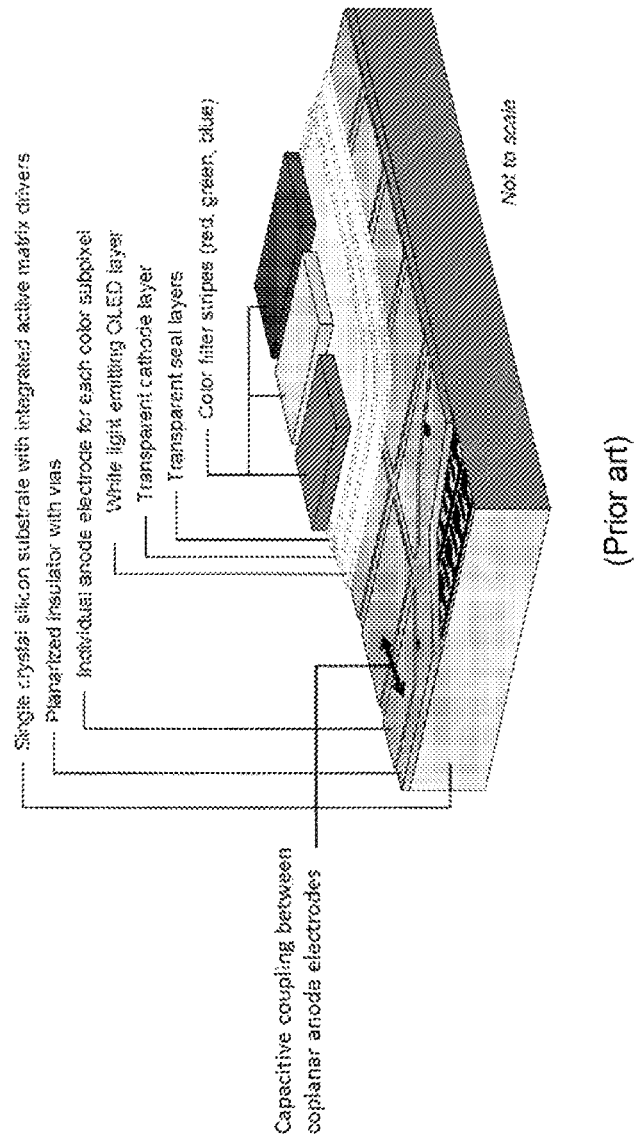
FIG. 2 shows the structure of a portion of an idealized AMOLED microdisplay, including the location where the capacitive coupling between coplanar anode electrodes may occur.
Figure 3:
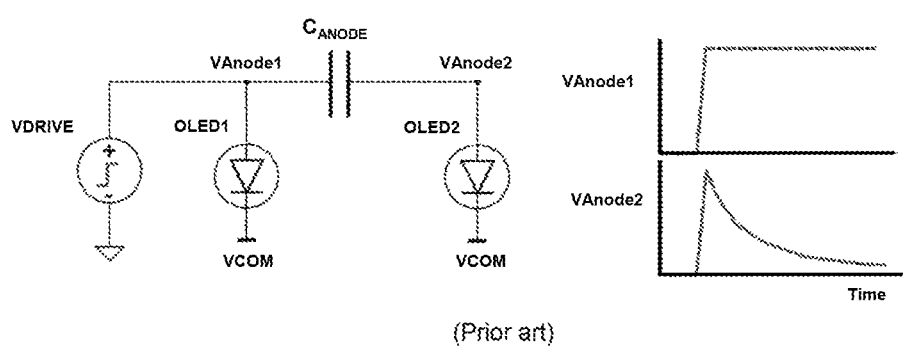
FIG. 3 is a simplified electrical model for cross-talk including, at the left a schematic diagram of adjacent anodes and the drive signal for the OLEDs, and at the right idealized waveforms for the anodes.

A circuit model for each anode configuration is helpful to understand how the ground plane will reduce cross-talk. FIG. 3 gave the circuit model for the standard anode configuration shown in FIG. 4. A voltage source $V_{DRIVE}$ is used to drive the OLED1 pixel with a signal waveform VAnode1 as shown in the waveform inset on the right of the figure. The pixel is driven from the off condition (VAnode1=0) to the on state (VAnode1≈5V). The adjacent pixel is represented by OLED2 and had previously been driven to the off state. Due to signal coupling through the capacitor Canode the voltage VAnode2 on the adjacent pixel is temporarily increased and then slowly discharges, resulting in a short pulse of light emitted from the un-driven pixel. For typical microdisplay conditions this short pulse of light creates an average brightness over a frame period that shows up as unwanted display cross-talk.

FIG. 9 provides the circuit model for the first and second preferred embodiments of the present invention in which the anode configuration has a ground plane as described. In addition to the coplanar coupling capacitor Canode, the model includes the capacitors between each anode and the ground plane Cgnd. The capacitors act as a voltage divider so that the signal on the un-driven pixel will be given by the drive voltage $V_{DRIVE}$ multiplied by the capacitor ratio Canode/Cgnd. This ratio is approximately equal to the coplanar capacitance divided by the parallel plate capacitance which previously was shown to be about 0.067 for the typical microdisplay. As a consequence, the voltage on the un-driven pixel will be less than 7% of the value in the standard anode configuration. Since the OLED light level is exponentially dependent on its drive voltage, there will be a very dramatic reduction in cross-talk due to the smaller voltage coupled between adjacent anodes.

While only a limited number of preferred embodiments of the present invention has been disclosed for purposes of illustration, it is obvious that many modifications and variations could be made thereto. It is intended to cover all of those modifications and variations which fall within the scope of the present invention, as defined by the following claims.

I claim:

1. An OLED microdisplay comprising:
   a silicon substrate with integrated active matrix drivers;
   an OLED array comprising at least two color subpixels situated over the silicon substrate;
   an anode for each of the at least two color subpixels, each of the anodes extending in spaced relation on the silicon substrate defining a gap;
   a conductive plane situated on the silicon substrate, the conductive plane in alignment with the gap between each of the anodes;
   an insulating layer situated between the conductive plane and each of the anodes; and
   an electrical connection between the conductive plane and a ground.

2. The microdisplay according to claim 1 wherein the conductive plane comprises a continuous sheet.

3. The microdisplay according to claim 1 wherein the conductive plane comprises a metal layer.

4. The microdisplay of claim 1 further comprising:
   openings disposed in a pattern around vias in the silicon substrate to connect each pixel anode.

5. The microdisplay of claim 1 wherein the silicon substrate has a ground line and
   wherein the electrical connection comprises contact points to the ground line through the silicon substrate.

6. The microdisplay according to claim 1 wherein the insulating layer is thin enough to effectively suppress cross-talk between the anodes.

7. The microdisplay according to claim 1 wherein the ratio between anode coplanar capacitance and capacitance of the anode to ground is less than 0.1.

8. An OLED microdisplay comprising:
   a substrate;
   a pixel array comprising a plurality of pixels situated over the substrate;
   at least one anode for each pixel of the pixel array, each of the at least one anode for each pixel extending in spaced relation on the substrate defining a gap between an anode of an adjacent pixel of the pixel array;
   a patterned conductive layer underneath the pixel array in alignment with the gap between the anode of the adjacent pixel and the at least one anode to form an effective ground plane in order to reduce electrical cross-talk between adjacent pixels in the pixel array; and
   an insulating layer situated between the patterned conductive layer and the anodes of the pixel array.

9. The OLED microdisplay according to claim 8, wherein the insulating layer is thin enough to effectively suppress cross-talk between the adjacent anodes.

10. The OLED microdisplay according to claim 8, further comprising:
openings disposed in a pattern around vias in the substrate to connect each of anodes of the pixel array.

11. The OLED microdisplay according to claim 8, wherein the patterned conductive layer comprises a continuous sheet.

12. The OLED microdisplay according to claim 8, wherein the patterned conductive layer comprises a metal layer.

13. The OLED microdisplay according to claim 8, further comprising:
an electrical connection between the patterned conductive layer and a ground,
wherein the substrate has a ground line, and
wherein the electrical connection comprises contact points to the ground line through the substrate.

* * * * *